United States Patent
Li et al.

(10) Patent No.: US 10,324,258 B2
(45) Date of Patent: Jun. 18, 2019

(54) LIGHT EMITTING DEVICE WITH IMPROVED GRATINGS AND METHOD FOR MANUFACTURING THE DEVICE

(71) Applicants: Hisense Broadband Multimedia Technologies Co., Ltd., Qingdao, Shandong Province (CN); Hisense Broadband Multimedia Technologies, Ltd., Tortola (VG); Huazhong University of Science and Technology, Wuhan, Hubei Province (CN)

(72) Inventors: Xun Li, Wuhan (CN); Zekun Lin, Wuhan (CN); Hua Zhang, Qingdao (CN)

(73) Assignees: Hisense Broadband Multimedia Technologies Co., Ltd., Qingdao, Shandong (CN); Hisense Broadband Multimedia Technologies, Ltd., Tortola (VG); Huazhong University of Science and Technology, Wuhan, Hubei Province (CN)

( * ) Notice: Subject to any disclaimer, the term of this patent is extended or adjusted under 35 U.S.C. 154(b) by 34 days.

(21) Appl. No.: 15/492,582

(22) Filed: Apr. 20, 2017

(65) Prior Publication Data

US 2018/0081114 A1    Mar. 22, 2018

(30) Foreign Application Priority Data

Sep. 20, 2016 (CN) .......................... 2016 1 0835197

(51) Int. Cl.
*G02B 6/12* (2006.01)
*G02B 6/34* (2006.01)
(Continued)

(52) U.S. Cl.
CPC ......... *G02B 6/124* (2013.01); *G02B 6/12002* (2013.01); *H01S 5/026* (2013.01);
(Continued)

(58) Field of Classification Search
CPC ..... G02B 6/124; G02B 6/12002; H01S 5/026; H01S 5/021; H01S 5/1035; H01S 5/1215; H01S 5/1246; H01S 2301/173
See application file for complete search history.

(56) References Cited

U.S. PATENT DOCUMENTS 4,674,100 A * 6/1987 Kobayashi .............. G02F 3/026
372/50.11
5,164,956 A * 11/1992 Lang ....................... H01S 5/125
372/108
(Continued)

FOREIGN PATENT DOCUMENTS

CN         102779892 A     11/2012
CN         102882129 A     1/2013
(Continued)

OTHER PUBLICATIONS

Cloutier, S.G., P.A. Kossyrev and J. Xu, Optical gain and stimulated emission in periodic nanopatterned crystalline silicon. Nature materials, 2005. 4(12): p. 887-891.
(Continued)

*Primary Examiner* — Akm E Ullah
(74) *Attorney, Agent, or Firm* — Brinks Gilson & Lione

(57) ABSTRACT

A light emitting device, an optical module and a manufacturing method thereof are disclosed. According to an example of the disclosure, the light emitting device may comprise an optical waveguide chip, a light emitting chip and a grating between the light emitting chip and the optical waveguide chip. The light emitting chip may emit laser light. The grating may couple the laser light emitted from the
(Continued)

active layer into the optical waveguide chip in a way that the laser light is output along a length direction of the optical waveguide chip.

11 Claims, 14 Drawing Sheets

(51) Int. Cl.
H01S 5/10 (2006.01)
G02B 6/124 (2006.01)
H01S 5/026 (2006.01)
H01S 5/18 (2006.01)
H01S 5/02 (2006.01)
H01S 5/12 (2006.01)

(52) U.S. Cl.
CPC .......... *H01S 5/0268* (2013.01); *H01S 5/1032* (2013.01); *H01S 5/18* (2013.01); *G02B 6/34* (2013.01); *G02B 2006/12104* (2013.01); *G02B 2006/12121* (2013.01); *G02B 2006/12147* (2013.01); *H01S 5/021* (2013.01); *H01S 5/1035* (2013.01); *H01S 5/1039* (2013.01); *H01S 5/1215* (2013.01); *H01S 5/1246* (2013.01); *H01S 2301/173* (2013.01)

(56) References Cited

U.S. PATENT DOCUMENTS

| | | | | |
|---|---|---|---|---|
| 5,682,239 | A * | 10/1997 | Matsumoto | G03F 7/70633 250/548 |
| 7,450,624 | B2 * | 11/2008 | Evans | B82Y 20/00 372/103 |
| 7,480,429 | B1 * | 1/2009 | Chiniwalla | G02B 6/1228 385/129 |
| 8,267,583 | B2 * | 9/2012 | Yao | G02B 6/13 384/31 |
| 8,503,841 | B2 * | 8/2013 | Kopp | G02B 6/126 385/11 |
| 8,577,193 | B2 * | 11/2013 | Zhou | G02B 6/124 385/37 |
| 9,715,064 | B1 * | 7/2017 | Gambino | G02B 6/124 |
| 2008/0212637 | A1 * | 9/2008 | Makino | B82Y 20/00 372/50.11 |
| 2010/0142580 | A1 * | 6/2010 | Gilet | H01S 5/026 372/50.11 |
| 2011/0235659 | A1 * | 9/2011 | Fukuda | B82Y 20/00 372/20 |
| 2011/0299561 | A1 * | 12/2011 | Akiyama | H01S 5/02248 372/50.11 |
| 2015/0205062 | A1 * | 7/2015 | Collins | G02B 6/34 385/14 |
| 2015/0286008 | A1 * | 10/2015 | Shimizu | G02B 6/34 385/37 |
| 2017/0317471 | A1 * | 11/2017 | Lor | G02B 6/124 |

FOREIGN PATENT DOCUMENTS

| | | |
|---|---|---|
| CN | 104319627 | 1/2015 |
| EP | 0 623 980 A2 | 11/1994 |
| WO | WO 2016/011002 A1 | 1/2016 |

OTHER PUBLICATIONS

Lombardo, S., et al., Room-temperature luminescence from Er-implanted semi-insulating polycrystalline silicon. Applied physics letters, 1993. 63(14): p. 1942-1944.
Rong, H., et al., A continuous-wave Raman silicon laser. Nature, 2005. 433(7027): p. 725-728.
Liu, A.Y., et al., High performance continuous wave 1.3 μm quantum dot lasers on silicon. Applied Physics Letters, 2014. 104(4): p. 041104.
Camacho-Aguilera, R.E., et al., An electrically pumped germanium laser. Optics Express, 2012. 20(10): p. 11316-11320.
Fang, A.W., et al., Electrically pumped hybrid AlGaInAs-silicon evanescent laser. Optics Express, 2006. 14(20): p. 9203-9210.
Fang, A.W., et al., Hybrid silicon evanescent devices. Materials Today, 2007. 10(7): p. 28-35.
Bakir, B.B., et al., Electrically driven hybrid Si/111-V Fabry-Perot lasers based on adiabatic mode transformers, Optics express, 2011 . 19(11): p. 10317-10325.
Roelkens, G., et al., 111-V/Si photonics by die-to-wafer bonding. Materials Today, 2007. 10(7): p. 36-43.
Keyvaninia, S., et al., Heterogeneously integrated 111-V/silicon distributed feedback lasers. Optics letters, 2013. 38(24): p. 5434-5437.
Fathollahnejad, H., et al., Vertical-cavity surface-emitting lasers integrated onto silicon substrates by PdGe contacts. Electronics Letters, 1994. 30(15). p. 1235-1236.
Park, G.C., et al. Hybrid 111-V/SOI single-mode vertical-cavity laser with in-plane emission into a silicon waveguide, in CLEO: Science and Innovations. 2015: Optical Society of America.
Urino, Y., et al., First demonstration of high density optical interconnects integrated with lasers, optical modulators, and photodetectors on single silicon substrate. Optics express, 2011 . 19(26): p. B 159-B 165.
European Search Report corresponding to European Patent Application No. 17170083.4 dated Nov. 28, 2017, 8 pages.

* cited by examiner

LIGHT EMITTING DEVICE WITH IMPROVED GRATINGS AND METHOD FOR MANUFACTURING THE DEVICE

CROSS REFERENCE TO RELATED APPLICATIONS

This patent application claims priority to Chinese Patent Application No. 201610835197.X entitled "Optical module and manufacturing method thereof" filed on Sep. 20, 2016, the entire content of which is incorporated herein by reference.

TECHNICAL FIELD

The present disclosure relates to a light emitting device, an optical module and a manufacturing method thereof.

BACKGROUND

A hybrid laser may comprise an III-V group chip and a silicon on insulator (SOI for short) chip, which are laminated together. Where, the III-V group chip may comprise an electrode structure, a buffer layer and an active layer laminated sequentially, and the active layer can emit laser light when a preset current is input to the electrode structure. The SOI chip may comprise a substrate, an oxide layer and a silicon waveguide laminated sequentially.

When manufacturing a hybrid laser with an III-V group chip and an SOI chip, the III-V group chip and the SOI chip may be laminated as one piece by a bonding process. For example, the active layer in the III-V group chip and the silicon waveguide in the SOI chip may be bonded together by a bonding process, so that laser light emitted from the active layer in the III-V group chip can be coupled to the silicon waveguide in the SOI chip by means of evanescent wave coupling and propagate outwards substantially along the silicon waveguide.

SUMMARY

The present disclosure discloses a light emitting device, an optical module and a manufacturing method thereof so as to improve the manufacturing efficiency of a light emitting device in a hybrid laser. The technical solutions are as follows.

According to a first aspect of the present disclosure, a light emitting device is provided. The light emitting device comprises: a light emitting chip to emit laser light; an optical waveguide chip to output the laser light; and a grating which is between the light emitting chip and the optical waveguide chip and configured to couple the laser light emitted from the light emitting chip into the optical waveguide chip in a way that the laser light is output along the length direction of the optical waveguide chip.

According to a second aspect of the present disclosure, an optical module is provided. The optical module may comprise the light emitting device as described in the first aspect.

According to a third aspect of the present disclosure, a method for manufacturing light emitting device is provided. The method may comprise: forming a second grating on an optical waveguide chip; and providing a light emitting chip on the optical waveguide chip in a way that the second grating is capable of coupling laser light emitted from the light emitting chip into the optical waveguide chip and causing the laser light to be output along the length direction of the optical waveguide chip.

The method as described in the third aspect may further comprise: forming a first grating on the light emitting chip. Wherein, the light emitting chip is configured to emit laser light propagating in a direction parallel to the length direction of the light emitting chip, the first grating is configured to change propagation direction of laser light in a way that the laser light emitted from the light emitting chip propagates in a direction substantially orthogonal to the length direction of the first grating and towards the optical waveguide chip, and the second grating is configured to change propagation direction of laser light in a way that the laser light injecting from the first grating towards the optical waveguide chip propagates in a direction substantially parallel to the length direction of the optical waveguide chip and injects into the optical waveguide chip.

According to a fourth aspect of the present disclosure, a method for manufacturing light emitting device is provided. The method may comprise: fabricating a III-V group structure on a first substrate, wherein the III-V group structure comprises a buffer layer, an active layer, a first grating and an upper cladding layer which are laminated sequentially; fabricating an SOI chip comprising a second substrate, an oxide layer, an optical waveguide layer and a second grating which are laminated sequentially; welding the III-V group structure to the SOI chip in a way that the first grating and the second grating are arranged between the optical waveguide layer and the active layer; separating the first substrate from the III-V group structure; and forming an electrode structure on one side of the buffer layer away from the active layer. Where, the active layer is used to emit laser light propagating in a direction parallel to the length direction of the active layer, the first grating is used to change the propagation direction of laser light in a way that the laser light emitted from the active layer propagates in a direction substantially orthogonal to the length direction of the first grating and towards the second grating, and the second grating is used to change the propagation direction of laser light in a way that the laser light injecting into the second grating propagates in a direction substantially parallel to the length direction of the second grating and towards the optical waveguide layer.

As a first grating and a second grating are provided between a light emitting chip and an optical waveguide chip, when the light emitting chip emits laser light propagating in a direction parallel to the length direction of the light emitting chip, the laser light emitted from the light emitting chip can be coupled into the optical waveguide chip and output from the optical waveguide chip by changing the propagation direction of the laser light with the first grating and the second grating. As the light emitting chip and the optical waveguide chip are not coupled with each other by a bonding process based on evanescent wave, the process for manufacturing the light emitting device and the optical module can be effectively simplified and efficiency of manufacturing the light emitting device and the optical module can be improved.

BRIEF DESCRIPTION OF DRAWINGS

In order to more clearly illustrate the technical solutions of embodiments of the present disclosure, the drawings required to be used in the description of the embodiments will be briefly described below. It is obvious that the drawings described below are only some embodiments of the present disclosure. It will be apparent to ordinary person skilled in the art that other drawings may be obtained based on the accompanying drawings without inventive efforts, wherein.

DETAILED DESCRIPTION

To make the purposes, technical solutions and advantages of the present disclosure clearer, embodiments of the present disclosure will be described below in detail in combination with the drawings.

Figure 1A:
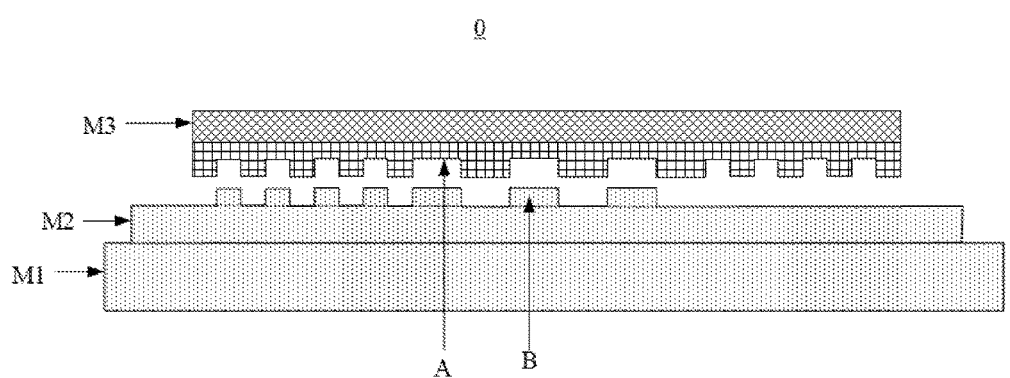
FIG. 1A is a side view of a light emitting device provided by a disclosed embodiment.

FIG. 1A is a side view of a light emitting device 0 provided by an embodiment of the present disclosure. As shown in FIG. 1A, the light emitting device 0 may comprise a substrate M1, an optical waveguide layer M2, a first grating A, a second grating B and an active layer M3. Where, the optical waveguide layer M2, the first grating A, the second grating B and the active layer M3 are sequentially laminated on the substrate M1. The active layer M3 is used to emit laser light and propagation direction of the laser light is parallel to the length direction of the active layer M3. Length direction refers to a direction which is parallel to a laminating interface between two adjacent layers. For example, the length direction of the active layer M3 refers to a direction parallel to a laminating interface between the active layer M3 and the first grating A, that is, the direction orthogonal to the laminating direction. Hereinafter, the length direction of the active layer M3 may also be referred to as the length direction of a light emitting chip including the active layer M3. The first grating A is used to change the propagation direction of the laser light in a way that the laser light emitted from the active layer M3 will propagate in a direction substantially orthogonal to the length direction of the first grating A and towards the second grating B. The second grating B is used to change the propagation direction of the laser light in a way that the laser light injecting into the second grating B will propagate in a direction substantially parallel to the length direction of the second grating B and injects into the optical waveguide layer M2 after passing through the second grating B.

As the first grating A and the second grating B are provided between the active layer M3 and the optical waveguide layer M2, when the propagation direction of the laser light emitted from the active layer M3 is parallel to the length direction of the active layer M3, the laser light emitted from the active layer M3 may be coupled into the optical waveguide layer M2 and output from the optical waveguide layer M2 by changing the propagation direction of the laser light with the first grating and the second grating. As can be seen from the above, the active layer M3 and the optical waveguide layer M2 are coupled with each other by changing the propagation direction of the laser light with the first grating and the second grating, other than by means of a coupling way based on evanescent wave. Where, the evanescent wave refers to a kind of electromagnetic wave produced due to total reflection on an interface of two different media, and the amplitude of the evanescent wave will attenuate exponentially as the depth orthogonal to the interface increases. Therefore, when manufacturing the light emitting device 0, the optical waveguide layer M2 and the second grating B can be directly formed on the substrate M1 as well as the first grating A can be directly formed on the active layer M3 without using a bonding process. In this way, the whole process for manufacturing light emitting device may be simplified, the time for manufacturing light emitting device and/or light module may be effectively reduced, and thus the efficiency of manufacturing light emitting device and/or light module can be improved.

The first grating A and the second grating B are located between the optical waveguide layer M2 and the active layer M3, and the first grating A may be close to the active layer M3 while the second grating B may be close to the optical waveguide layer M2. As an example, the optical waveguide layer M2, the second grating B, the first grating A and the active layer M3 may be sequentially laminated on the substrate M1. In this way, when manufacturing the light emitting device, a process for manufacturing semiconductor may be used. For example, the optical waveguide layer M2 may be grown on the substrate M1, and the second grating B may be grown on the optical waveguide layer M2. Alternately, the second grating B may be formed by directly etching the side of the optical waveguide layer M2 away from the substrate M1.

As an example, the optical waveguide layer M2 may be made of a silicon containing material such as Si, SiN, SiON, $SiO_2$, or the like. In this way, the optical waveguide layer M2 may be a silicon waveguide layer.

Figure 1B:
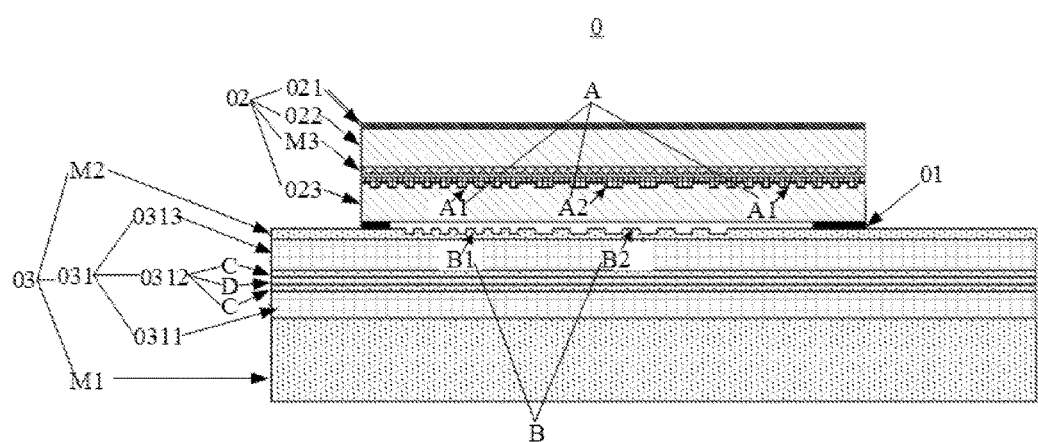
FIG. 1B is a side view of a light emitting device provided by another disclosed embodiment.

FIG. 1B is a side view of a light emitting device 0 provided by another embodiment of the present disclosure. As shown in FIG. 1B, the light emitting device 0 may comprise a welding layer 01, a III-V group chip 02 and an SOI chip 03. Where, the III-IV group chip 02 and the SOI chip are welded to two opposite sides of the welding layer 01.

The III-V group chip 02 may comprise an electrode structure 021, a buffer layer 022, an active layer M3, a first grating A and an upper cladding layer 023, which are laminated sequentially. The SOI chip 03 may comprise a substrate M1, an oxide layer 031, an optical waveguide layer M2 and a second grating B, which are laminated sequentially. The second grating B may be a film layer on the SOI chip 03 which is close to the first grating A. The orthographic projection area of the welding layer 01 on the first grating A may not overlap with the orthographic projection area of the second grating B on the first grating A. The active layer M3 is used to emit laser light when a preset current is input to the electrode structure 021. In the embodiment, when the III-V group chip 02 is laminated on the SOI chip 03, the III-V group chip 02 may be directly weld to the SOI chip 03 via the welding layer 01 without using a bonding process.

Further, the III-V group chip 02 may be welded to the SOI chip 03 by means of a flip chip bonding with the welding layer 01. As the welding process is commonly performed with a higher reliability, if the III-V group chip 02 and the SOI chip 03 are coupled with each other by a welding process based on the first grating A and the second grating B, the coupling efficiency of the III-V group chip 02 and the SOI chip 03 may be higher.

In an embodiment of the present application, the first grating A may comprise two first first-order gratings A1 and one first second-order grating A2 between the two first first-order gratings A1. For example, the two first first-order gratings A1 may be located on two opposite sides of the first second-order grating A2. As shown in FIG. 1B, the first grating A may comprise one first first-order grating A1, one first second-order grating A2 and one first first-order grating A1 in sequence from left to right. The first first-order gratings A1 located on two opposite sides of the first second-order grating A2 may have a function of mode selection for laser light emitted from the active layer M3, i.e. configuration of the first first-order gratings A1 is related to a desired operating wavelength for the light emitting device. For example, the active layer M3 may emit laser light of at least one wavelength when a preset current is supplied to the electrode structure 021, and the first first-order gratings A1 can select laser light of a preset operating wavelength from the laser light of at least one wavelength. The mode selection mechanism provided by the first first-order gratings A1 may be expressed as follows:

$$\lambda = 2n_{eff}\Lambda_1.$$

Where, $\lambda$ is the desired operating wavelength of the light emitting device, $n_{eff}$ is an effective refractive index of resonant cavity of the III-IV group chip, and $\Lambda_1$ is a grating period of the first first-order gratings.

In addition, the first second-order grating A2 may twist the laser light selected by the first first-order gratings A1 in a way that the propagation direction of the laser light is changed from parallel to the length direction of the active layer M3 to orthogonal to the length direction of the active layer M3.

The active layer may emit laser light having a plurality of wavelengths. In a laser using a first-order grating to select mode, the resonant cavity of the III-V group chip therein may have a facet cleavage with an error of 1 to 2 µm, which may lead to a random phase of the facet, and thus there may be two modes emitting with a substantially equal probabilities. For example, laser light of a first wavelength and a second wavelength may be emitted with a substantially equal probability. This may reduce the single mode yield of device. In the light emitting device of the embodiment of the present disclosure, as the first grating A comprises not only the first first-order gratings A1, but also the first second-order grating A2, laser light of two modes may be attenuated by the first second-order grating A2 with different losses, so that the probability for emitting laser light in one mode may increase while the probability for emitting laser light in another mode may decrease, and thus improving the single mode yield of device.

In an embodiment of the present application, the second grating B may comprise a second first-order grating B1 and a second second-order grating B2. The second first-order grating B1 may be aligned with any one of the two first first-order gratings A1. For example, a line connecting the location of the second first-order grating B1 with one of the two first first-order gratings A1 is orthogonal to the length direction of the first first-order grating A1. The second second-order grating B2 may be aligned with the first second-order grating A2. For example, a line connecting the location of the second second-order grating B2 with the first second-order gratings A2 is orthogonal to the length direction of the first second-order grating A2. When the first grating A twist the propagation direction of the laser light in a way that the laser light propagates in a direction substantially orthogonal to the length direction of the first grating A (that is, orthogonal to the length direction of the active layer M3) and towards the second grating B (that is, toward the optical waveguide layer M2), the laser light can propagate in a direction substantially orthogonal to the length direction of the second grating B and towards the second grating B. The laser light propagating to the second second-order grating B2 may be twisted in a way that the propagation direction of the laser light is parallel to the length direction of the second grating B. The laser light output from the second grating B can inject into the optical waveguide layer M2, so that the laser light can propagate in the optical waveguide layer M2 in a direction substantially parallel to the length direction of the second grating B.

It should be noted that the second first-order grating B1 in FIG. 1B is located on the left side of the second second-order grating B2. As the propagation direction of the laser light is twisted by the second second-order grating B2 to be parallel to the length direction of the second grating B, the laser light can transmit to the left or right side of the second second-order grating B2. When the laser light transmits to the left side of the second second-order grating B2, the second first-order grating B1 may reflect the laser light, so that the laser light can transmit to the right side of the second second-order grating B2. When the laser light transmits to the right side of the second second-order grating B2, since there is none second first-order grating located on the right side of the second second-order grating B2, the laser light can continually transmit into the optical waveguide layer M2 on the right side of the second second-order grating B2. For example, as shown in FIG. 1B, the laser light emitted from the active layer M3 in the light emitting device 0 can finally output from the right side of the optical waveguide layer M2. In addition, if the laser light emitted from the active layer M3 in the light emitting device 0 is to be output from the left side of the optical waveguide layer M2, the second first-order grating B1 in the second grating B can be located on the right side of the second second-order grating B2.

As an example, the oxide layer 031 may comprise a first buried oxide layer (BOX for short) 0311, a reflective layer 0312 and a second buried oxide layer 0313, which are formed sequentially on the substrate M1. As the reflective layer 0312 is provided in the oxide layer 031, when some laser light leaks from the optical waveguide layer M2 and transmits to the reflective layer 0312, the reflective layer 0312 can reflect the leaked laser light to the second second-order grating B2 and then the leaked laser light is twisted by the second second-order grating B2 in a way that the leaked laser light propagates in the silicon waveguide M2. In this way, the leaked laser light can be effectively re-utilized, and the energy loss due to light leakage can be effectively decreased and even prevented.

According to an example, the reflective layer 0312 may be a distributed Bragg reflector (DBR for short), as shown in FIG. 1B. The DBR may comprise n silicon dioxide layers C and m silicon layers D which are alternately laminated on the first buried oxide layer 0311. Where, n is an integer greater than or equal to 1, and m is an integer greater than or equal to 1. FIG. 1B shows an example in which the DBR comprises two silicon dioxide layers C and one silicon layer D which are alternately formed on the first buried oxide layer 0311. In this way, as the refractive index difference between silicon and silicon dioxide is relatively higher, the reflectivity of the reflective layer 0312 with respect to laser light of a longer wavelength may be relatively higher, thereby ensuring a good light leakage prevention effect.

In a vertical cavity hybrid laser such as a vertical cavity silicon-based hybrid laser and a long wavelength vertical cavity hybrid laser, a light emitting chip can emit laser light orthogonal to the light emitting chip and the laser light can be twisted by a grating in a SOI chip in a way that the laser light propagates in a direction substantially parallel to a optical waveguide chip and towards the optical waveguide chip, so that the laser light can propagate in the optical waveguide chip. Obviously, since the light emitting chip can directly output laser light propagating in a direction orthogonal to the length direction of the optical waveguide chip, the first grating in the hybrid laser in the previous embodiment may not be necessary for the vertical cavity hybrid laser, that is, the vertical cavity hybrid laser can comprise the second grating merely. Also, as the light emitting chip and the optical waveguide chip in the vertical cavity hybrid laser are coupled with each other by means of coupling based on grating rather than evanescent wave, almost the same advantageous effects as the foregoing embodiments, i.e., simplifying the manufacturing process of light emitting device and optical module as well as improving the manufacturing efficiency of light emitting device and optical module, can be achieved.

Figure 2:
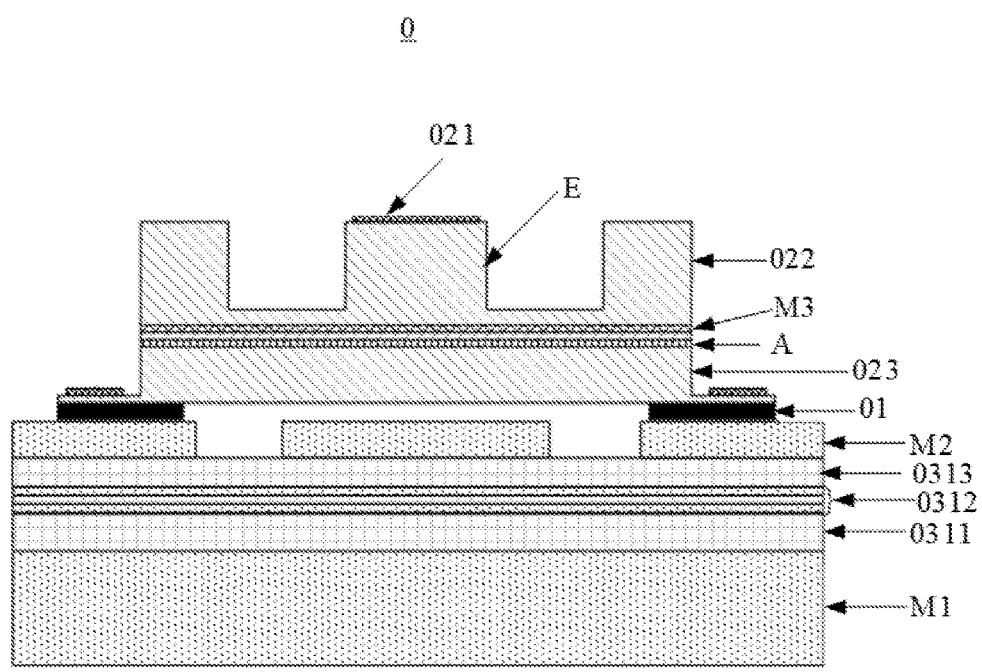
FIG. 2 is a sectional schematic view of a light emitting device provided by a disclosed embodiment.
Figure 3:
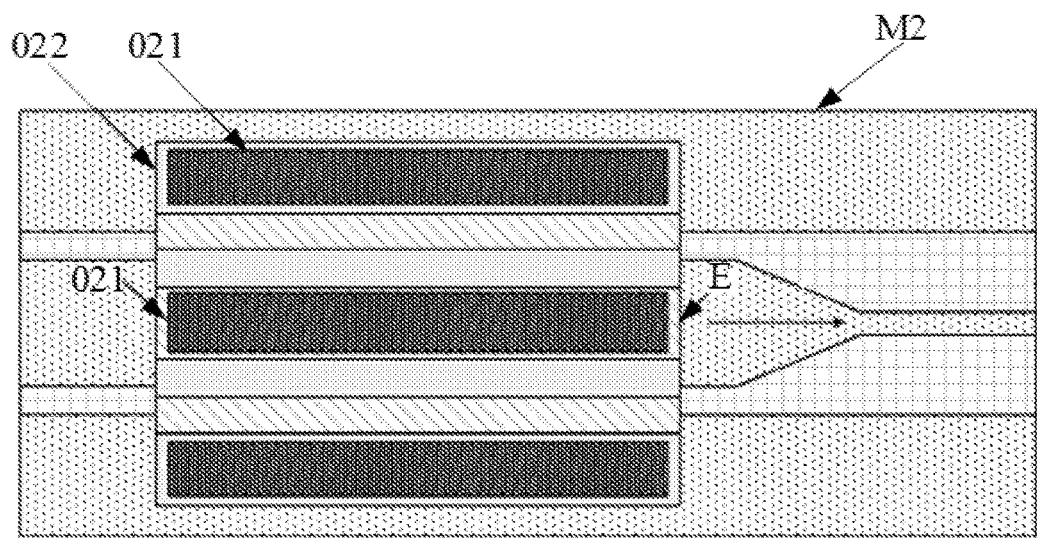
FIG. 3 is a top view of a light emitting device provided by a disclosed embodiment.

FIG. 2 is a sectional schematic view of the light emitting device 0 provided by an embodiment of the present disclosure and FIG. 3 is a top view of the light emitting device 0 provided by an embodiment of the present disclosure. As shown in FIG. 2 and FIG. 3, a convex part E may be formed on one side of the buffer layer 022 away from the first grating A, and the convex part E may be aligned with the parts for twisting propagation direction of the laser light. For example, a line connecting the location of the convex part E with the location of the first second-order grating A2 in the first grating A and/or the second second-order grating B2 in the second grating B may be orthogonal to the length direction of first grating A, so as to increase the effective refractive index of an area below the convex part E. Thus, as the convex part E can provide lateral confinement of the light field, the light field can be confined in the area below the convex part E, so that leakage of laser light to two opposite side faces can be reduced. In addition, the convex part E can also make the light field to be in a single transverse mode, for example, the lateral distribution of the light field is a single mode, rather than multiple transverse modes coherent lasing.

Figure 4:
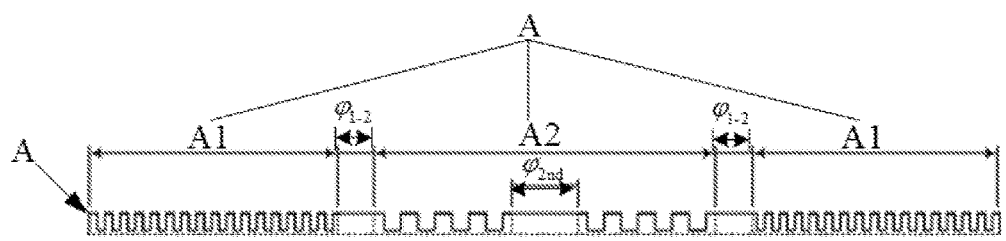
FIG. 4 is a structure schematic view of a first grating provided by a disclosed embodiment.

For example, FIG. 4 is a structure schematic view of a first grating A provided by an embodiment of the present disclosure. With reference to FIG. 1B and FIG. 4, the laser light selected by the first first-order gratings A1 from the laser light emitted from the active layer M3 is of a preset operating wavelength.

As a phase shift $\varphi_{1-2}$ at the connecting portion of the first first-order gratings A1 and the first second-order grating A2 may have a big influence on the near field distribution and the laser output power of the light emitting device, when manufacturing the first grating A, the phase shift $\varphi_{1-2}$ at the connecting portion of the first first-order gratings A1 and the first second-order grating A2 may be adjusted in a way that the output power of the laser light emitted from the light emitting device is maximized. For example, the phase shift $\varphi_{1-2}$ at the connecting portion of the first first-order gratings A1 and the first second-order grating A2 may be three-eighths of the preset operating wavelength. In addition, since a phase shift $\varphi_{2nd}$ at the centre part of the first second-order grating A2 may also have a big influence on the near field distribution and the laser output power of the light emitting device, the phase shift $\varphi_{2nd}$ at the centre part of the first second-order grating A2 may be adjusted in a way that the output power of the laser light emitted from the light emitting device is maximized. For example, the phase shift $\varphi_{2nd}$ at the centre part of the first second-order grating A2 may be a quarter of the operating wavelength.

Furthermore, in the III-V group chip 02 as shown in FIG. 1B, there are an etch stop layer (not shown in FIG. 1B), a first spacer layer (not shown in FIG. 1B) and a first confining layer (not shown in FIG. 1B) between the buffer layer 022 and the active layer M3, which are sequentially formed on the buffer layer 022. There are a second confining layer (not shown in FIG. 1B) and a second spacer layer (not shown in FIG. 1B) between the active layer M3 and the first grating A, which are sequentially formed on the active layer M3. There is an upper cladding layer 023 formed on the first grating A. The welding layer 01 may be welded to the upper cladding layer 023 and the silicon waveguide M2 on two opposite sides respectively. The electrode structure 021 may also reflect the laser light emitted from the active layer M3, so as to prevent light leakage. For example, a DBR may be formed on one side of the buffer layer 022 away from the active layer M3 to reflect the laser light emitted from the active layer M3. The present disclosure is not limited to this embodiment.

The buffer layer 022 may be made of InP. The etch stop layer may be made of InGaAsP. The first spacer layer and the second spacer layer may be made of InP. The first confining layer and the second confining layer may be made of InGaAsP or InAlGaAs (aluminum indium gallium arsenide). The active layer M3 may be made of InGaAsP or InAlGaAs. The first grating A may be made of InGaAsP. The upper cladding layer 023 may be made of InP. Additional, there may be an air spacer layer (not shown in figure) between the upper cladding layer 023 and the silicon waveguide M2. The optical waveguide layer M2 may be made of silicon. When the second grating B is formed by etching the optical waveguide layer M2, the optical waveguide layer M2 may comprise an unetched part of the silicon waveguide, a second first-order grating B1 resulted from etching the silicon waveguide, a second second-order grating B2 resulted from etching the silicon waveguide and an unetched part of the silicon waveguide from left to right or from right to left in sequence. In addition, the substrate M1 may also be made of silicon.

The light emitting device in the embodiment may be a hybrid laser, and the wavelength of the laser light output by the light emitting device, that is, the operating wavelength, may be 1550 nm. When manufacturing a light emitting device, a buffer layer 022, an etch stop layer, a first spacer layer, a first confining layer, an active layer M3, a second confining layer, a second spacer layer, a first grating A and a upper cladding layer 023 may be sequentially formed on a P-type substrate (first substrate), so as to obtain a III-V group structure. Then, the III-V group structure may be flip chip bonded to a prepared SOI chip 03, and the P-type substrate is removed from the III-V group structure (i.e., the P-type substrate is separated from the III-V group structure). After that, the buffer layer 022 may be etched to obtain a convex part on the buffer layer 022. It should be noted that, by etching the buffer layer 022, there may be two concave parts formed on two opposite sides of the convex part on the buffer layer 022. Finally, the electrode structure 021 may be formed on the etched buffer layer 022 to obtain the III-V group chip 02. As described above, the III-V group chip 02 may comprise an electrode structure 021, a buffer layer 022, an etch stop layer, a first spacer layer, a first confining layer, an active layer M3, a second confining layer, a second spacer layer, a first grating A and an upper cladding layer 023, which are laminated sequentially. Where, the electrode structure 021 may comprise one P-type electrode and two N-type electrodes. The P-type electrode may be formed on the convex part of the buffer layer 022. The two N-type electrodes may be formed on the concave parts on two opposite sides of the convex part of the buffer layer 022, respectively.

The electrode structure 021 may be made of metal such as gold, platinum and silver, and have a thickness of 100 nm. The buffer layer 022 may be made of P—InP (P-type InP), and have a thickness of 2.5 µm as well as a doping concentration of $0.7 \times 10^{18} \sim 2 \times 10^{18}$ per cubic centimeter. The etch stop layer may be made of P—InGaAsP (P-type InGaAsP), and have a thickness of 10 nm as well as doping concentration of $0.7 \times 10^{18}$ per cubic centimeter. The first spacer layer may be made of P—InP, and have a thickness of 50 nm as well as a doping concentration of $0.7 \times 10^{18}$ per cubic centimeter. The first confining layer may be made of InGaAsP, and have a thickness of 100 nm without being doped. The active layer M3 may be made of InGaAsP, and have quantum wells containing 6 wells and 7 barriers. Where, the thickness of each well may be 5 nm and the thickness of each barrier may be 10 nm. The active layer M3 may not be doped. The second confining layer may be made of InGaAsP, and have a thickness of 100 nm without being doped. The second spacer layer may be made of N—InP, and have a thickness of 50 nm as well as a doping concentration of $0.5 \times 10^{18}$ per cubic centimeter.

The first grating A may be made of N—InGaAsP (N-type InGaAsP), and have a thickness of 200 nm as well as a doping concentration of $0.5 \times 10^{18}$ per cubic centimeter. The length of the first first-order gratings A1 in the first grating A may be 100 µm, and the length of the first second-order grating A2 may be 200 µm. The duty ratio of the first first-order gratings A1 and the first second-order grating A2 may both be 0.5. The phase shift $\varphi_{1-2}$ at the connecting portion of the first first-order gratings A1 and the first second-order grating A2 may be three-eighths of the operating wavelength λ. The phase shift $\varphi_{2nd}$ at the centre part of the first second-order grating A2 may be a quarter of the operating wavelength λ. For example, the relevant parameters of the first grating A may be expressed as follows:

$$\phi_{1-2} = \frac{3}{8}\lambda,$$

$$\phi_{2nd} = \frac{1}{4}\lambda,$$

$$\lambda = 2n_{\it eff}\Lambda_1.$$

Where, λ is the operating wavelength, $n_{\it eff}$ is the effective refractive index of resonant cavity of the III-V group chip, and $\Lambda_1$ is the grating period of the first first-order gratings A1.

The upper cladding layer 23 may be made of N—InP, and have a thickness of 2 µm as well as a doping concentration of $0.5 \times 10^{18} \sim 1 \times 10^{18}$ per cubic centimeter. The etch stop layer may be made of N—InGaAsP, and have a thickness of 10 nm as well as a doping concentration of $1 \times 10^{18}$ per cubic centimeter. The facets on two opposite sides of the III-V group chip 02 may be natural cleavage. The width of the convex part on the buffer layer 022 may be 2.5 µm. An air spacer layer may be between the III-V group chip 02 and the SOI chip 03, and the thickness of the air spacer layer may be 0.7 µm.

The optical waveguide layer M2 may have a width of 4 µm and a thickness of 220 nm. At the output end of the silicon waveguide M2, the width of the waveguides may be gradually reduced to enable coupling with a optical fiber. For example, within a length of 200 µm, the width of the waveguide may be reduced from 4 µm to 500 nm. The first buried oxide layer 0311 and the second buried oxide layer 0313 may both be made of silicon dioxide, and have a thickness of 0.9 µm and 0.65 µm respectively. The thickness of the silicon layers D and the silicon dioxide layers C in the reflective layer 0312 of the DBR are both about one quarter of the operating wavelength. For example, assuming the operating wavelength is 1550 nm, the thickness of the silicon layers D and the silicon dioxide layers C may both be about 0.4 The substrate M1 may be made of silicon, and have a thickness of 20 cm. It should be appreciated that materials and associated parameters of all layers in the laser described herein may vary according to design requirements, and the present disclosure is not limited to these examples.

Figure 5:
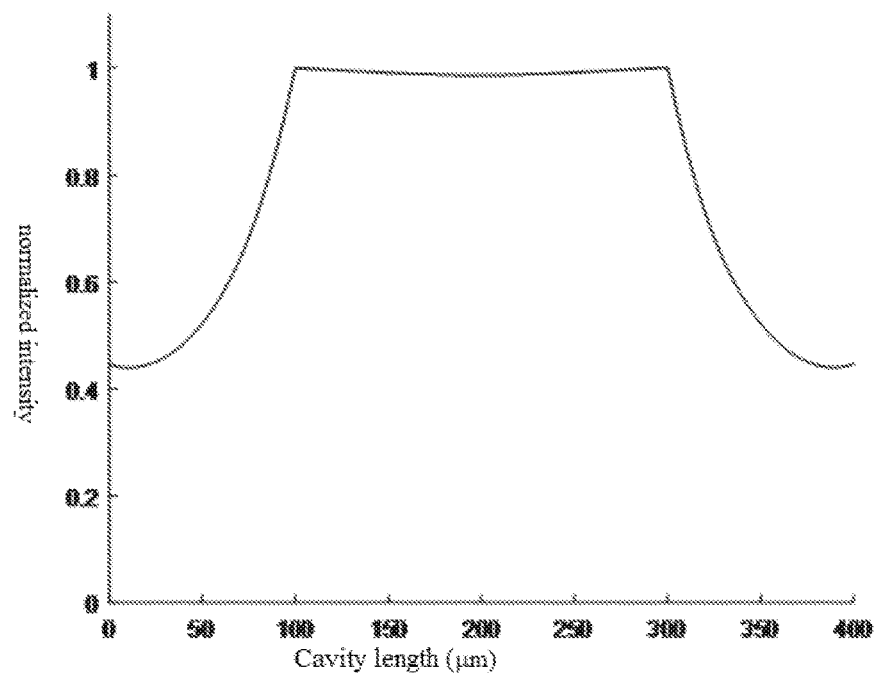
FIG. 5 is a total field distribution map of a guide field in a horizontal cavity of a light emitting device with an input current of 50 mA provided by a disclosed embodiment.
Figure 6:
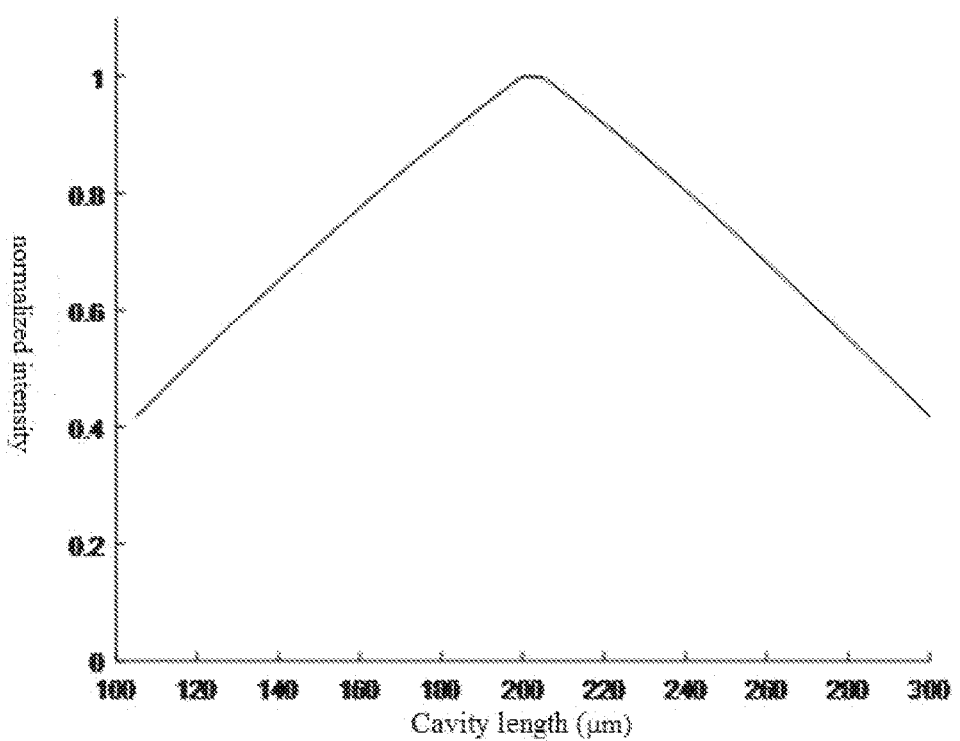
FIG. 6 is a near field distribution map of a vertically propagating radiation field of a light emitting device with an input current of 50 mA provided by a disclosed embodiment.
Figure 7:
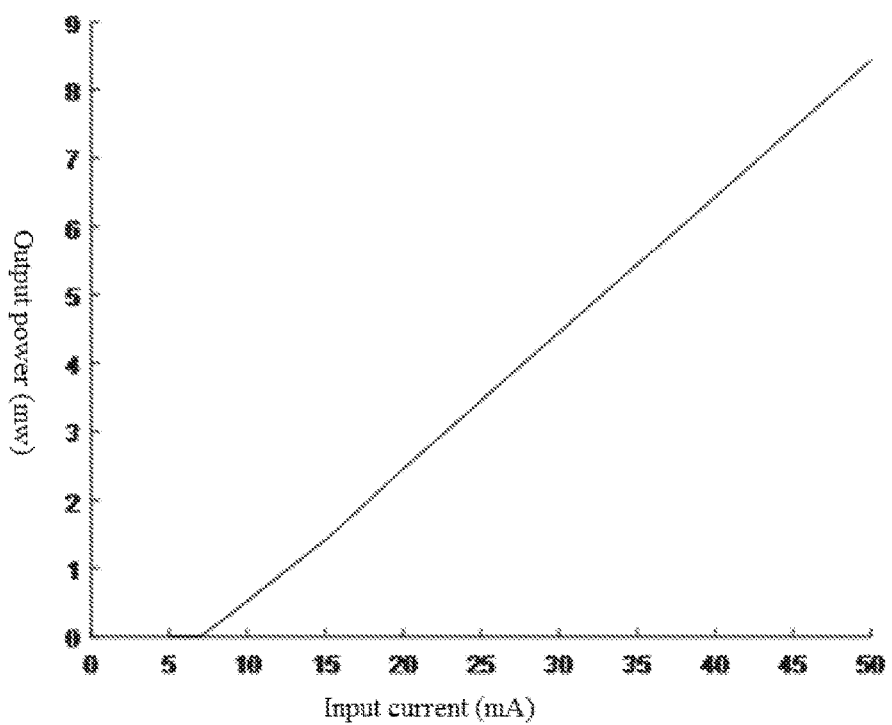
FIG. 7 is a changing curve of output power with respect to input current of a light emitting device provided by a disclosed embodiment.

When the above-mentioned light emitting device outputs laser light with a wavelength of 1550 nm, partial simulation results may be as shown in FIG. 5, FIG. 6 and FIG. 7. FIG. 5 is a total field distribution map of the guide field in the horizontal cavity of the light emitting device with an input current of 50 mA according to an embodiment of the present disclosure. FIG. 6 is a near field distribution map of the vertically propagating radiation field of the light emitting device with an input current of 50 mA according to an embodiment of the present disclosure. FIG. 7 is a changing curve of output power with respect to input current of the light emitting device according to an embodiment of the present disclosure.

As shown in FIG. 5, the horizontal axis in FIG. 5 indicates the cavity length of the horizontal cavity in the III-V group chip with an unit "µm", and the vertical axis indicates a normalized intensity. As can be seen from FIG. 5, since the first first-order gratings in the first grating have a larger feedback factor, most energy can be confined into the first second-order grating, so that the light emitting device may have a higher coupling efficiency and a lower facet leakage. Since the normalized feedback coupling coefficient of the first first-order gratings is relatively larger, for example, the normalized coupling coefficient may be 4, most energy may be confined into the first second-order grating, and the energy at the facets may be relatively lower, so that the leakage of energy from facets may be reduced.

As shown in FIG. 6, the horizontal axis indicates the cavity length of the horizontal cavity of the III-V group chip with an unit "μm", and the vertical axis indicates a normalized intensity. It can be seen from FIG. 6 that the light emitting device can have a good near field distribution when the phase shift at the connecting portion of the first first-order gratings A1 and the first second-order grating A2 and the phase shift at the centre part of the first second-order grating are adjusted to appropriate values.

As shown in FIG. 7, the horizontal axis indicates an input current with an unit "mA" and the vertical axis indicates an output power of the laser with an unit "mW". As can be seen from FIG. 7, the threshold current is about 7.5 mA, the slope efficiency is about 0.195 W/A, and the coupling efficiency of III-V group chip with the SOI chip is calculated to be 46.5%. Where, the slope efficiency may represent the electro-optical conversion efficiency of the semiconductor laser. With the same operating current, the higher the slope efficiency is, the higher the output power of the laser is. For example, on the light-current-voltage (LIV) curve of a semiconductor laser, the slope efficiency can be expressed as a ratio of the optical power increment with respect to the operating current increment as shown in the following equation:

Slope efficiency=optical power increment/operating current increment.

To sum up, according to the embodiments of the present disclosure, a light emitting device is provided. As the first grating A and the second grating B may be provided between the active layer M3 and the optical waveguide layer M2, when the propagation direction of the laser light emitted from the active layer M3 is parallel to the length direction of the active layer M3, by changing the propagation direction of the laser light with the first grating A and the second grating B, the laser light emitted from the active layer M3 may finally be coupled into the optical waveguide layer M2 and output from the optical waveguide layer M2. That is, the active layer M3 and the optical waveguide layer M2 in the embodiments of the present disclosure are not coupled with each other by means of coupling based on evanescent wave, but by changing the light propagation direction with the two gratings A and B, and thus the laser light emitted from the active layer M3 is coupled into the optical waveguide layer M2. Therefore, when manufacturing a light emitting device, the optical waveguide layer and the second grating may be formed directly on the substrate and the first grating may be formed on the light emitting chip, without using a bonding process. In this way, the whole manufacturing process of light emitting device can be relatively simple, which can effectively reduce the time for manufacturing light emitting device and/or optical module, and thus improve the efficiency for manufacturing light emitting device and optical module.

Figure 8A:
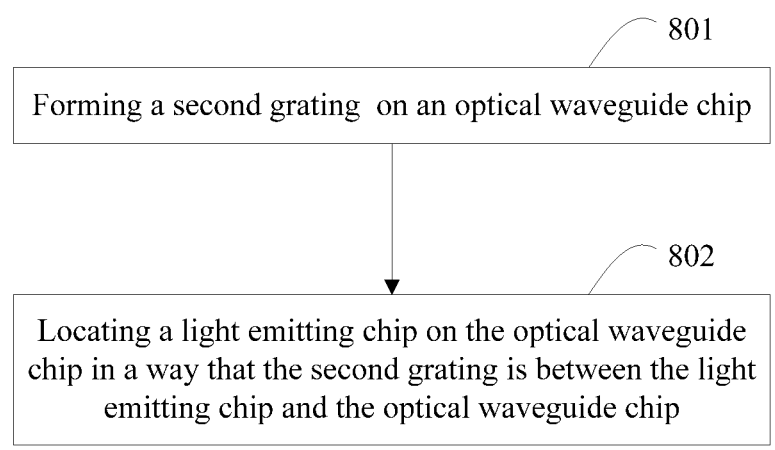
FIG. 8A is a flow chart of a method for manufacturing light emitting device provided by a disclosed embodiment.

As shown in FIG. 8A, a method for manufacturing light emitting device is provided according to an embodiment of the present disclosure. The method may be used to manufacture a hybrid laser such as a vertical cavity hybrid laser and the like. The method may comprise the following steps.

At block 801, a second grating is formed on an optical waveguide chip.

At block 802, a light emitting chip is arranged on the optical waveguide chip in a way that the second grating is between the light emitting chip and the optical waveguide chip.

Where, the second grating is between the light emitting chip and the optical waveguide chip, and can couple laser light emitted from the light emitting chip into the optical waveguide chip in a way that the laser light emitted from the light emitting chip propagates substantially along the length direction of the optical waveguide chip. For example, the light emitting chip may be configured to emit laser light propagating in a direction orthogonal to the length direction of the light emitting chip, and the second grating may be configured to change the propagation direction of the laser light in a way that the laser light injecting from the light emitting chip towards the optical waveguide chip propagates in a direction substantially parallel to the length direction of the optical waveguide chip and then injects into the optical waveguide chip.

Figure 8B:
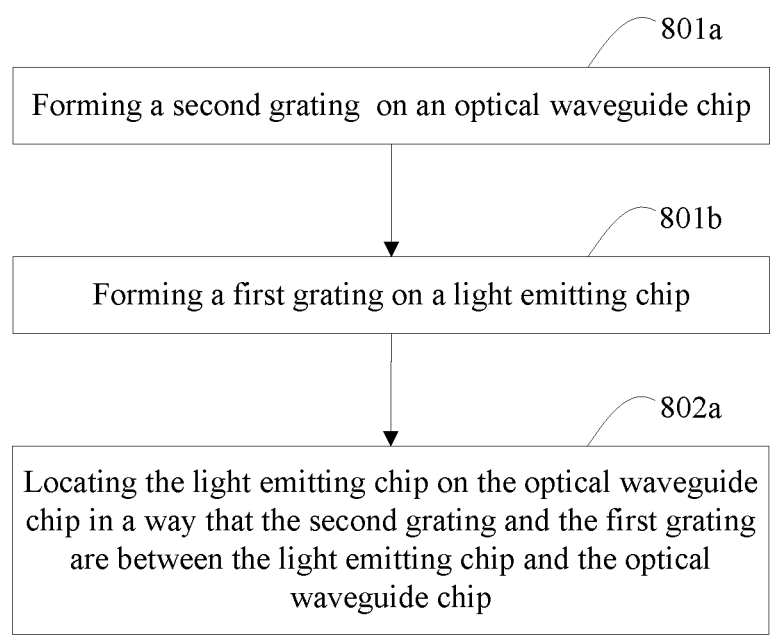
FIG. 8B is a flow chart of a method for manufacturing light emitting device provided by another disclosed embodiment.

As shown in FIG. 8B, a method for manufacturing light emitting device is provided according to an embodiment of the present disclosure. The method may be used to manufacture the light emitting device as shown in FIG. 1A, FIG. 1B, FIG. 2 or FIG. 3. The method for manufacturing light emitting device may comprise the following steps.

At block 801*a*, a second grating is formed on an optical waveguide chip.

At block 801*b*, a first grating is formed on a light emitting chip.

At block 802*a*, the light emitting chip is arranged on the optical waveguide chip in a way that the first grating and the second grating are between the light emitting chip and the optical waveguide chip.

Where, the block 801*a* may be executed first, followed by the block 801*b*; or the block 801*b* may be executed first, followed by the block 801*a*; or the blocks 801*a* and 801*b* may be executed at the same time. The light emitting chip may be configured to emit laser light propagating in a direction parallel to the length direction of the light emitting chip. The first grating may be configured to change propagation direction of laser light in a way that the laser light emitted from the light emitting chip propagates in a direction substantially orthogonal to the length direction of the first grating and towards the second grating. The second grating may be configured to change propagation direction of laser light in a way that the laser light injecting into the second grating propagates in a direction substantially parallel to the length direction of the second grating and can inject into the optical waveguide chip after passing through the second grating.

To sum up, according to the method for manufacturing light emitting device, a first grating and a second grating are formed between a light emitting chip and an optical waveguide chip, and the propagation direction of laser light emitted from the light emitting chip is parallel to the length direction of the light emitting chip. By changing propagation direction of laser light with the first grating and the second grating, the laser light emitted from the light emitting chip may be coupled into the optical waveguide chip and can output from the optical waveguide chip finally. That is, the light emitting chip and the optical waveguide chip in the embodiment are coupled with each other by changing light propagation direction with two gratings, rather than by means of coupling based on evanescent wave, and then the laser light emitted from the light emitting chip may be coupled into the optical waveguide chip. In this way, when manufacturing light emitting device with the method, the optical waveguide chip and the second grating may be formed directly on the substrate, and the first grating may be formed on the light emitting chip, without using a bonding process. Therefore, the whole process for manufacturing light emitting device may be relatively simple, which may effectively reduce time for manufacturing light emitting device and/or optical module, and improve efficiency of manufacturing light emitting device and/or optical module.

The first grating and the second grating may be both located between the optical waveguide chip and the light emitting chip. Where, the first grating is close to the light emitting chip, and the second grating is close to the optical waveguide chip. As an example, an optical waveguide chip, a second grating, a first grating and a light emitting chip may be sequentially laminated on a substrate. It should be noted that, when manufacturing the light emitting device, a semiconductor manufacturing process may be employed. For example, the optical waveguide chip may be grown on the substrate, and then the second grating may be grown on the optical waveguide chip. In another example, the second grating may be generated by etching one side surface of the optical waveguide chip away from the substrate directly.

Figure 8C:
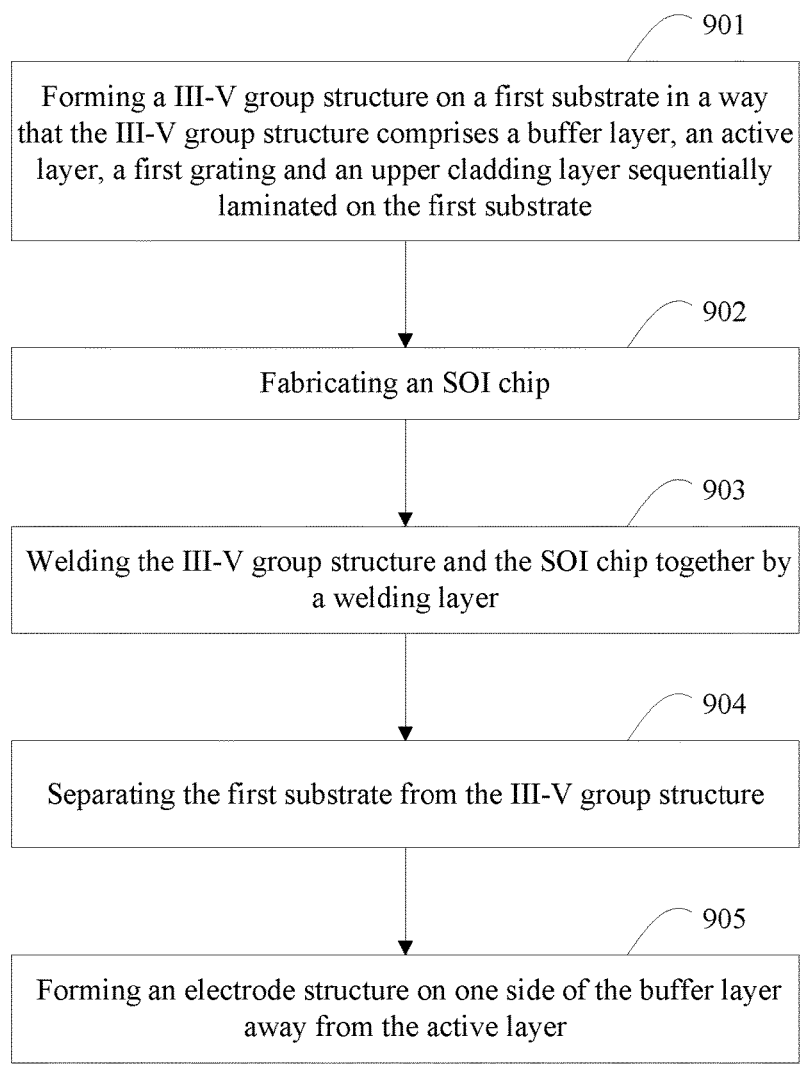
FIG. 8C is a flow chart of a method for manufacturing light emitting device provided by another disclosed embodiment.

Optionally, the light emitting device may comprise a welding layer, an III-V group chip as light emitting chip and an SOI chip as optical waveguide chip. The III-V group chip and the SOI chip are welded to the welding layer on two opposite sides respectively. The III-V group chip may comprise the active layer and the first grating, and the SOI chip may comprise the optical waveguide chip and the second grating. As shown in FIG. 8C, a method for manufacturing light emitting device is provided according to another example of the present disclosure, and the method may comprise the following steps.

At block 901, a III-V group structure is formed on a first substrate. Where, the III-V group structure comprises a buffer layer, an active layer, a first grating and an upper cladding layer, which are sequentially laminated on the first substrate.

At block 902, an SOI chip is fabricated. Where, the SOI chip comprises a second substrate, an oxide layer, an optical waveguide layer and a second grating, which are sequentially laminated.

As an example, the optical waveguide layer may be made of silicon, that is, the optical waveguide layer may be a silicon waveguide layer.

At block 903, the III-V group structure and the SOI chip are welded together by a welding layer.

At block 904, the first substrate is separated from the III-V group structure.

At block 905, an electrode structure is formed on one side of the buffer layer away from the active layer and thus a light emitting device is obtained.

Where, the III-V group chip comprises the electrode structure, the buffer layer, the active layer, the first grating and the upper cladding layer which are laminated sequentially. The optical waveguide layer may be a film layer on the SOI chip and is close to the first grating on the III-V group chip. The orthographic projection area of the welding layer on the first grating may not overlap with the orthographic projection area of the second grating on the first grating. The active layer may be configured to emit laser light when a preset current is input to the electrode structure.

Figure 9A:
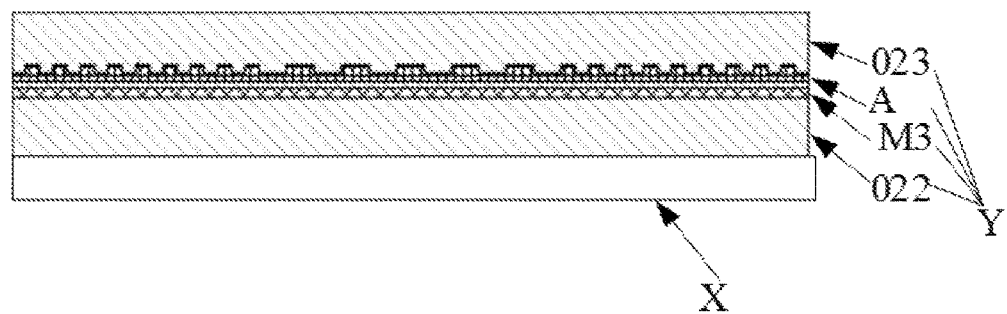
FIG. 9A is a partial structural schematic view of a light emitting device provided by a disclosed embodiment.

As shown in FIG. 9A, the first substrate X may be a P-type substrate. When manufacturing the III-V group structure Y, a buffer layer 022, an etch stop layer (not shown in FIG. 9A), a first spacer layer (not shown in FIG. 9A), a first confining layer (not shown in FIG. 9A), an active layer M3, a second confining layer (not shown in FIG. 9A), a second spacer layer (not shown in FIG. 9A), a first grating A and an upper cladding layer 023 may be sequentially formed on the P-type substrate X.

Figure 9B:
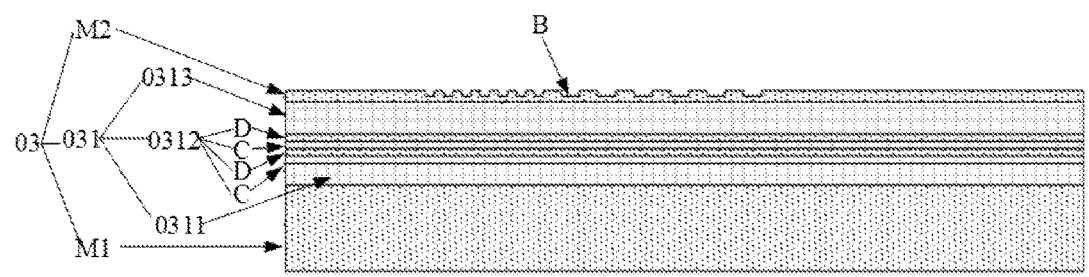
FIG. 9B is a partial structural schematic view of a light emitting device provided by another disclosed embodiment.

As shown in FIG. 9B, when manufacturing the SOI chip 03 at block 902, a first buried oxide layer 0311, a silicon dioxide layer C, a silicon layer D, a silicon dioxide layer C, a silicon layer D, a second buried oxide layer 0313, an optical waveguide layer M2 and a second grating B may be sequentially formed on the second substrate M1.

Figure 9C:
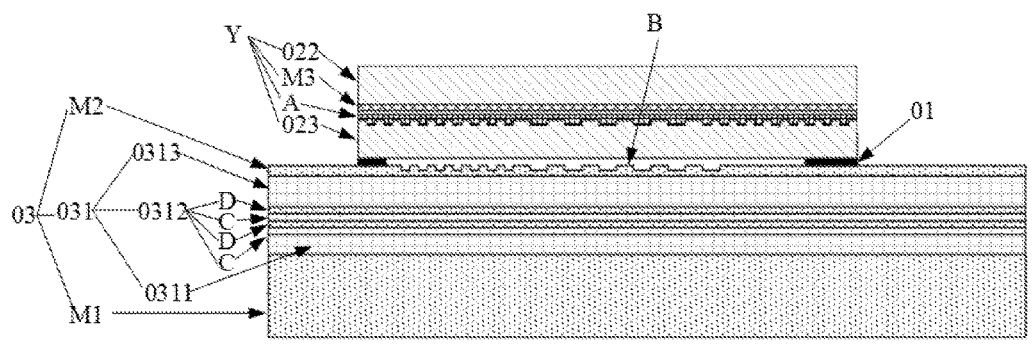
FIG. 9C is a partial structural schematic view of a light emitting device provided by another disclosed embodiment.

As shown in FIG. 9C, at block 903, the III-V group structure Y and the SOI chip 03 can be flip chip bonded via the welding layer 01.

Before proceeding to the block 905, the buffer layer 022 may be etched to obtain a convex part on the buffer layer 022. It should be noted that, after etching the buffer layer 022, concave parts may be formed on two opposite sides of the convex part on the buffer layer 022.

At block 905, the electrode structure 021 may be formed on the etched buffer layer 022, so that the III-V group chip 02 as shown in FIG. 2 or FIG. 3 may be obtained. The III-V group chip 02 may comprise an electrode structure, a buffer layer, an etch stop layer, a first spacer layer, a first confining layer, an active layer, a second confining layer, a second spacer layer, a first grating and an upper cladding layer which are laminated sequentially. Where, the electrode structure 021 may comprise one P-type electrode and two N-type electrodes. The P-type electrode may be formed on the convex part of the buffer layer 022. The two N-type electrodes may be formed on the two concave parts which are on two opposite sides of the convex part respectively.

The III-V group structure Y and the SOI chip 03 may be welded together by welding two opposite sides of the welding layer 01 to the III-V group structure Y and the SOI chip 03 respectively. According to another embodiment of the present disclosure, the III-V group structure Y and the SOI chip 03 may be laminated first, and then a welding material may be added between the III-V group structure Y and the SOI chip 03 to form the welding layer 01, so that the III-V group structure and the SOI chip may be welded together by the welding layer 01.

The first grating A may comprise two first first-order gratings and one first second-order grating, and the second grating B may comprise a second first-order grating and a second second-order grating. Where, the two first first-order gratings may be located on two opposite sides of the first second-order grating, respectively. The second first-order grating may be aligned with any one of the two first first-order gratings, and the second second-order grating may be aligned with the first second-order grating.

To sum up, according to the method for manufacturing light emitting device, a first grating and a second grating are formed between an active layer and an optical waveguide layer, and propagation direction of the laser light emitted from the active layer is parallel to the length direction of the active layer. By changing the propagation direction of the laser light with the first grating and the second grating, the laser light emitted from the active layer may be coupled into the optical waveguide layer and output from the optical waveguide layer finally. That is, the active layer and the optical waveguide layer are coupled with each other by changing the light propagation direction with two gratings, rather than by means of coupling based on evanescent wave, and then the laser light emitted from the active layer may be coupled into the optical waveguide layer. In this way, when manufacturing a light emitting chip, the optical waveguide layer and the second grating may be formed directly on the substrate, and the first grating may be formed on the active layer, without using a bonding process. Therefore, the whole process for manufacturing light emitting device is relatively simple, which may effectively reduce time for manufacturing light emitting device and optical module, and improve efficiency for manufacturing light emitting device and optical module.

It will be apparent to those skilled in the art that the specific operation of the described light emitting device and manufacturing method may be referred to the corresponding process in the aforementioned embodiments for the sake of convenience and conciseness of the description and will not be described here again.

The foregoing is only preferred exemplary embodiments of the present disclosure and is not intended to be used to limit the present disclosure, and any modifications, equivalent substitutions, improvements and the like within the spirit and principles of the present disclosure are intended to be embraced by the protection range of the present disclosure.

What is claimed is:

1. A light emitting device, comprising:
   a light emitting chip configured to emit laser light;
   an optical waveguide chip configured to output the laser light; and
   a grating positioned between the light emitting chip and the optical waveguide chip, wherein the grating is configured to couple the laser light emitted from the light emitting chip into the optical waveguide chip in a way that the laser light is output along a length direction of the optical waveguide chip;
   wherein, the light emitting chip is configured to emit laser light propagating in a direction parallel to the length direction of the light emitting chip; and
   wherein the grating comprises:
      a first grating beneath the light emitting chip, the first grating configured to change propagation direction of laser light so that the laser light emitted from the light emitting chip propagates in a direction substantially orthogonal to the length direction of the first grating and towards the optical waveguide chip, wherein the first grating comprises:
         two first first-order gratings configured to select laser light of a preset operating wavelength from the laser light emitted from the light emitting chip and being of at least one wavelength; and
         one first second-order grating positioned between the two first first-order gratings, wherein the first second-order grating is configured to twist propagation direction of laser light in a way that the laser light selected by the first first-order gratings propagates in a direction substantially orthogonal to the length direction of the light emitting chip and towards the optical waveguide chip;
      a second grating above the optical waveguide chip, the second grating configured to change propagation direction of laser light so that the laser light injecting from the first grating towards the optical waveguide chip propagates in a direction substantially parallel to the length direction of the optical waveguide chip and injects into the optical waveguide chip, wherein the second grating comprises:
         one second second-order grating aligning with the first second-order grating; and
         one second first-order grating aligning with one of the first first-order gratings;
         wherein the second second-order grating is configured to twist propagation direction of laser light in a way that the laser light injecting into the second grating propagates in a direction substantially parallel to the length direction of the optical waveguide chip; and wherein the second first-order grating is configured to reflect the laser light output from the second second-order grating.

2. The light emitting device of claim 1, wherein,
   a phase shift at a connecting portion of the first first-order gratings and the first second-order grating is three-eighths of the operating wavelength; and
   a phase shift at a centre part of the first second-order grating is a quarter of the operating wavelength.

3. The light emitting device of claim 1, wherein,
   the second first-order grating is positioned on a left side of the second second-order grating, and
   the laser light emitted from the light emitting chip is finally output from a right side of the optical waveguide chip.

4. The light emitting device of claim 1, wherein,
   the second first-order grating is positioned on a right side of the second second-order grating, and
   the laser light emitted from the light emitting chip is finally output from a left side of the optical waveguide chip.

5. The light emitting device of claim 1, wherein, the optical waveguide chip comprises:
   a substrate;
   an oxide layer comprising a first buried oxide layer, a reflective layer and a second buried oxide layer which are sequentially laminated on the substrate; and
   an optical waveguide layer on one side of the oxide layer away from the substrate, wherein the optical waveguide layer is configured to receive the laser light output from the grating, and the reflective layer is configured to reflect laser light leaking from the optical waveguide layer back.

6. The light emitting device of claim 5, wherein,
   the reflective layer comprises n number of silicon dioxide layers and m number of silicon layers alternately laminated on the first buried oxide layer, the n is an integer greater than or equal to 1, the m is an integer greater than or equal to 1; and
   each of the silicon layers and the silicon dioxide layers has a thickness substantially equal to one quarter of an operating wavelength of the light emitting device.

7. The light emitting device of claim 1, wherein, the light emitting chip comprises:
   an active layer to emit the laser light; and
   a buffer layer on one side of the active layer away from the grating, the buffer layer has a convex part on one side away from the active layer in a way that the convex part aligns with a part of the grating for twisting propagation direction of laser light.

8. An optical module comprising a light emitting device according to claim 1.

9. A method for manufacturing a light emitting device, the method comprising:
   forming a first grating on a light emitting chip;
   forming a second grating on an optical waveguide chip; and
   placing the light emitting chip on the optical waveguide chip so that the first grating and the second grating are positioned between the light emitting chip and the optical waveguide chip;
   wherein the light emitting chip is configured to emit laser light propagating in a direction parallel to a length direction of the light emitting chip;
   wherein the first grating is provided beneath the light emitting chip and configured to change propagation direction of laser light in a way that the laser light emitted from the light emitting chip propagates in a direction substantially orthogonal to the length direction of the first grating and towards the optical waveguide chip; and wherein the second grating is provided above the light emitting chip and configured to change propagation direction of laser light in a way that the laser light injecting from the first grating towards the optical waveguide chip propagates in a direction substantially parallel to the length direction of the optical waveguide chip and injects into the optical waveguide chip;

wherein the first grating comprises:
two first first-order gratings configured to select laser light of a preset operating wavelength from the laser light emitted from the light emitting chip and being of at least one wavelength; and
one first second-order grating positioned between the two first first-order gratings, wherein the first second-order grating is configured to twist propagation direction of laser light in a way that the laser light selected by the first first-order gratings propagates in a direction substantially orthogonal to the length direction of the light emitting chip and towards the optical waveguide chip; and wherein the second grating comprises:
one second second-order grating aligning with the first second-order grating, wherein the second second-order grating is configured to twist propagation direction of laser light in a way that the laser light injecting into the second grating propagates in a direction substantially parallel to the length direction of the optical waveguide chip; and
one second first-order grating aligning with one of the first first-order gratings, wherein the second first-order grating is configured to reflect the laser light output from the second second-order grating.

10. The method of claim 9, wherein,
the first grating comprises two first first-order gratings and one first second-order grating positioned between the two first first-order gratings; and
the second grating comprises one second first-order grating and one second second-order grating, the second first-order grating is aligned with one of the first first-order gratings, and the second second-order grating is aligned with the first second-order grating.

11. A method for manufacturing a light emitting device of any one of claims 1 or 2-8.

* * * * *